US006573725B2

(12) United States Patent
Kieres et al.

(10) Patent No.: US 6,573,725 B2
(45) Date of Patent: *Jun. 3, 2003

(54) SENSOR FOR NON-CONTACTING ELECTROSTATIC DETECTOR

(75) Inventors: Jerzy Kieres, East Amherst, NY (US); Nenad Nenadic, Brighton, NY (US); Thomas B. Jones, Brighton, NY (US)

(73) Assignee: Trek, Inc., Medina, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/939,359

(22) Filed: Aug. 24, 2001

(65) Prior Publication Data

US 2003/0038638 A1 Feb. 27, 2003

(51) Int. Cl.[7] .................................................. G01R 5/28
(52) U.S. Cl. .......................... 324/458; 324/457; 73/651; 310/330
(58) Field of Search ..................... 73/579, 651, 504.12, 73/504.14, 504.15, 504.16; 331/156; 324/457, 458, 762, 109; 310/330, 329

(56) References Cited

U.S. PATENT DOCUMENTS

| 4,763,078 A | * | 8/1988 | Williams | 324/458 |
| 5,285,686 A | * | 2/1994 | Peters | 73/504.15 |
| 5,600,251 A | * | 2/1997 | Akiyama | 324/457 |

* cited by examiner

*Primary Examiner*—Christine Oda
*Assistant Examiner*—Vincent Q. Nguyen
(74) *Attorney, Agent, or Firm*—Hodgson Russ LLP (57) ABSTRACT

A sensor for an electrostatic detector including an elongated vibratory element supported at a mechanical node at one end in the manner of a cantilever beam, a sensitive electrode on the vibratory element near the other end and adapted to be disposed toward an electrical charge, field or potential being measured, and a driver transducer on the vibratory element for vibrating the element in a direction to vary the capacitive coupling between the electrode and the electrical charge, field or potential being measured. The driver transducer is at a location along the beam and is operated at a vibratory frequency such that a virtual mechanical node appears along the beam. This, in turn, reduces vibration at the mechanical attachment node so that the degree of stiffness of the mechanical node does not affect the operating frequency and/or the displacement at the free end of the cantilever.

16 Claims, 5 Drawing Sheets

SENSOR FOR NON-CONTACTING ELECTROSTATIC DETECTOR

BACKGROUND OF THE INVENTION

The invention relates to the electrical measurement art, and more particularly to a new improved sensor or probe for use as a non-contacting electrostatic field, electrostatic voltage, or electrostatic charge detecting device.

Non-contacting electrostatic detectors are employed in those applications where electrical charge transferred to the measuring device through physical contact with the surface, circuit, or device being measured/monitored would modify or destroy the data. Such measurements include, for example, monitoring the voltage level of a photoconductor used in a copy machine or other electrophotographic processes, monitoring of electrostatic charge build-up on a dielectric web process line such as is used in textile or plastic film manufacturing processes, or monitoring the area around semiconductor manufacturing/handling processes where charge accumulation presents a source of product contamination or destruction through electrostatic discharge (arcing) events.

Heretofore, electrostatic sensors/probes of the type required to produce high accuracy, fast speed, low noise measurements, and yet be of physically small size, have been too expensive to manufacture to allow their use in higher quantity lower cost processes and/or apparatus such as low end laser printers, copy machine, or multiple point electrostatic charge build-up monitoring systems.

SUMMARY OF THE INVENTION

It is, therefore, a primary object of this invention to provide a new and improved sensor/probe for electrostatic measurements which satisfies the foregoing requirements yet is of low cost to manufacture.

It is a further object of this invention to provide a sensor/probe having electrical performance independent of both the mass of the sensor/probe and/or the mass of the clamping/holding structure used to place the sensor/probe into its measurement position relative to the surface or area under test.

It is a further object of this invention to provide such a sensor/probe which minimizes or more easily eliminates the production of noise and offset signals thereby avoiding the need for providing relatively large spacing between electrical elements of the sensor/probe amplifier circuitry and sensor/probe housing elements thus reducing the ability of contamination to enter into the inside of the sensor/probe structure.

It is a further object of this invention to provide a sensor/probe which can be easily configured to provide various spatial resolution characteristics.

It is a further object of this invention to provide a sensor/probe having an electrical speed of response which is substantially increased so as to accurately measure more rapidly changing electrostatic parameters.

It is a further object of this invention to provide such a sensor/probe which is small in size, simple in construction, economical to manufacture and reliable in operation.

The present invention provides a sensor for an electrostatic detector comprising an elongated vibratory element supported at a mechanical node at one end in the manner of a cantilever beam, a sensitive electrode on the vibratory element near the other end and adapted to be disposed toward an electrical charge, field or potential being measured, and driver means on the vibratory element for vibrating the element in a direction to vary the capacitive coupling between the electrode and the electrical field or potential being measured. The driver means is at a location along the beam and is operated at a vibratory frequency such that a virtual mechanical node appears along the beam. This, in turn, reduces vibration at the mechanical attachment node so that the degree of stiffness of the mechanical node does not affect the operating frequency and/or the displacement at the free end of the cantilever. The variation of the vibration amplitude of the beam and thus the detector's motion amplitude at the end of the beam is made independent of both the mass of the sensor/probe and/or the mass of the structure, such as a clamping/holding fixturing, used to place the sensor/probe into its measuring position relative to the surface or area under test. The electrical performance is thus stabilized and is made independent of the particular clamping/holding structure used. An amplifier on the vibratory element has an input connected to the sensitive electrode and an output adapted for connection to a readout/measuring device such as an electrostatic voltmeter. According to a preferred embodiment of the present invention the vibratory frequency corresponds to the second vibrational node of the beam and the driver means is located on the beam in overlapping relation to the peak of the beam vibration near the middle thereof.

The foregoing and additional advantages and characterizing features of the present invention will become clearly apparent upon a reading of the ensuing detailed description together with the included drawing wherein:

DETAILED DESCRIPTION OF THE ILLUSTRATED EMBODIMENT

Figure 1:
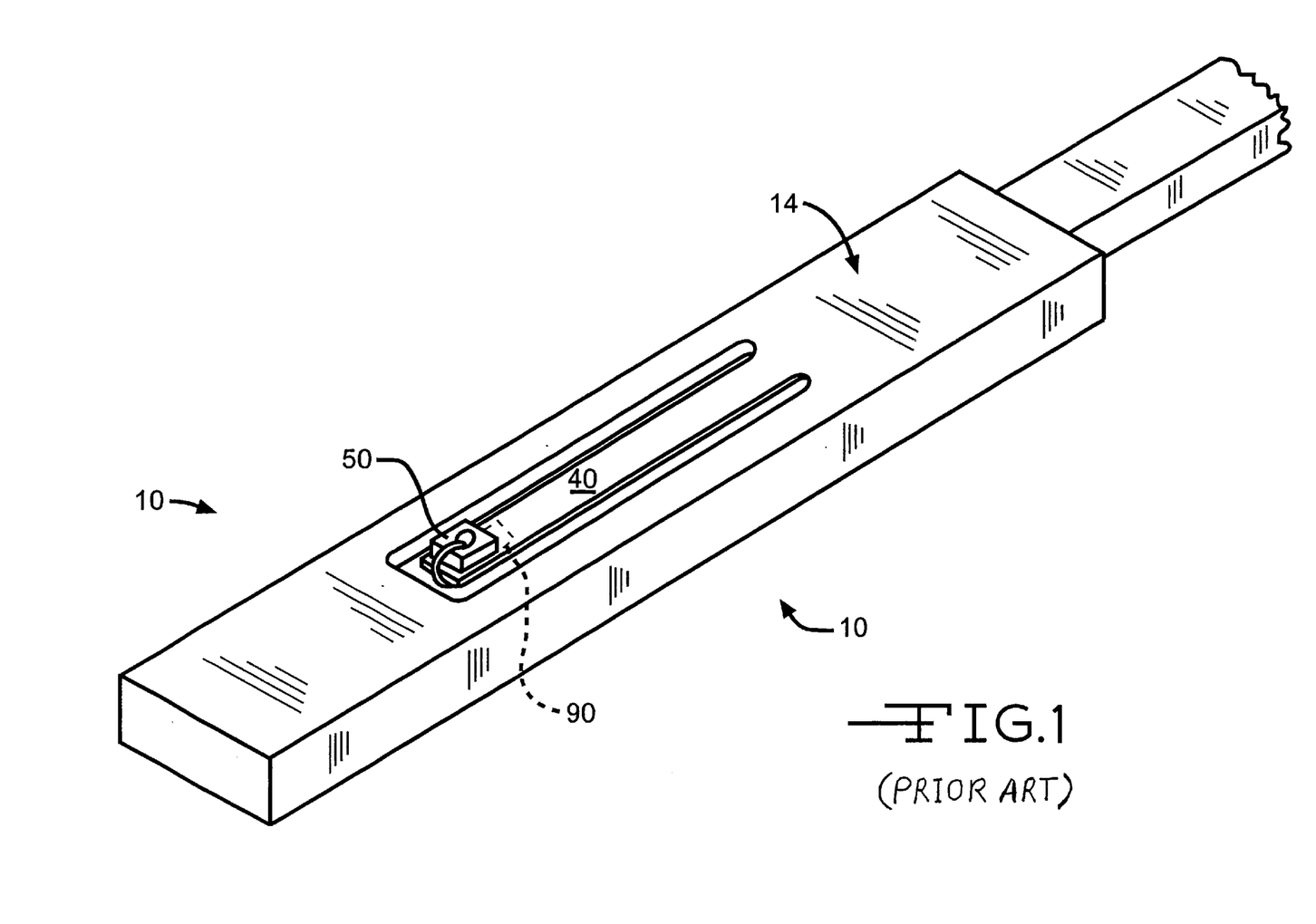
FIG. 1 is a perspective view with parts removed of a prior art sensor.

Referring first to FIG. 1, there is shown a prior art sensor generally designated 10 wherein a vibrating element 40, in the form of a single cantilever, has an end connected by either attachment or integration into the baseplate 14 while the free end provides a mounting surface for an amplifier 90 and a sensitive electrode 50. For a more detailed description of prior art sensor 10, reference may be made to U.S. Pat. No. 4,763,078 issued Aug. 9, 1988 entitled "Sensor For Electrostatic Voltmeter", the disclosure of which is hereby incorporated by reference.

As conventionally known, a simple cantilever beam in vibration produces unbalanced mechanical torque at the point of attachment or connection to the mechanical node structure, or, in the case of the sensor of FIG. 1, a baseplate structure. This is in contrast to a double cantilever beam structure, such as a tuning fork, where the mechanical forces produced by the motion of each of the tines of the tuning fork can be made equal and opposite thus producing no net mechanical torque at the common connection (fulcrum) of the fork. Therefore, a tuning fork operates at a stable amplitude and frequency as a function of mass (or mounting stiffness) present at the fulcrum whereas a single cantilever beam of the type shown in FIG. 1 is unstable in frequency and amplitude of vibration as the mechanical mass or mechanical stiffness at the baseplate attachment point varies. This unstable effect is particularly troublesome as an attempt is made to reduce the physical size of the baseplate structure in an effort to reduce the sensor/probe size and/or weight.

In particular, as the size of the probe is reduced significantly from the illustrative size shown and described in U.S. Pat. No. 4,763,078, the amplitude of vibration of the free end of the cantilever beam can become unstable and dependent upon the fixturing used to position the sensor/probe relative to the surface/area under test. In addition, due to the unbalanced nature of a single cantilever beam causing the probe/sensor structure as well as the mounting fixture to be involved in the mechanical vibration system of the cantilever, undesired audible vibrations are produced and radiated outside of the sensor/probe structure to cause annoying audible noise. These mechanically undesirable effects could be eliminated by using an inherently balanced tuning fork in place of the single cantilever beam. However, manufacturing costs when using the double cantilever, i.e., tuning forks, would be prohibitive because the tuning fork cannot be easily fabricated as an integrated part of the baseplate 14 by inexpensive chemical milling processes or the like.

Figure 2A:
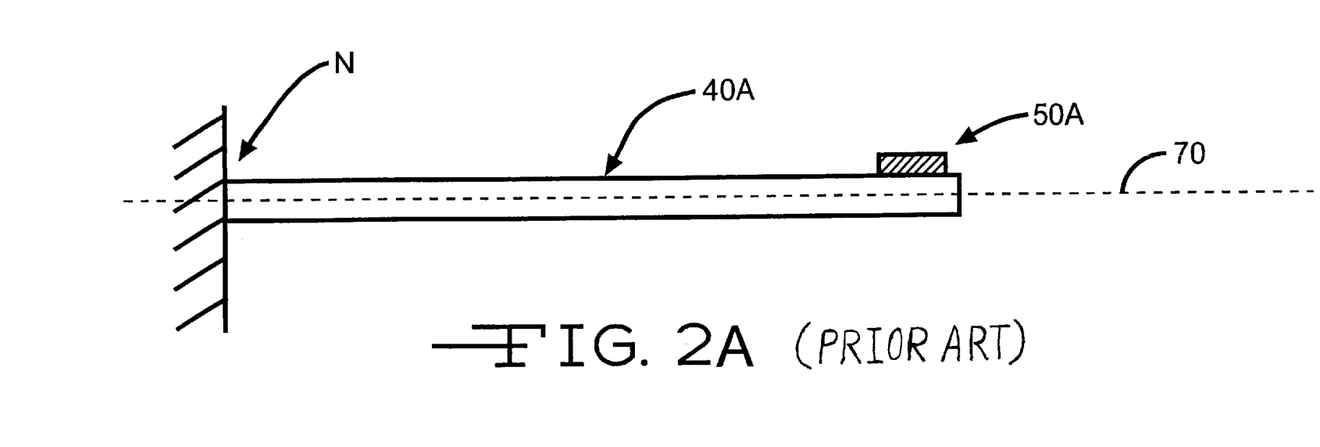
FIGS. 2A and 2B are diagrammatic views illustrating operation of the cantilever beam in the sensor of FIG. 1.

FIG. 2A illustrates the operation of the single cantilever of the device of FIG. 1 described in U.S. Pat. No. 4,763,078. As shown, the cantilever beam 40A is supported at one end at a mechanical node (N) while the other end is free to vibrate. FIG. 2A shows the cantilever beam 40A in the unenergized or rest position. A line 70 drawn through the beam to the mounting node (N) defines this rest position. Upon application of power to the oscillator circuitry including the drive and feedback piezoelectric ceramic chips (not shown), the cantilever beam 40A is made to oscillate at or around its fundamental resonate frequency (approximately 700 hz for the dimensions shown in the illustrative device of U.S. Pat. No. 4,763,078).

Figure 2B:
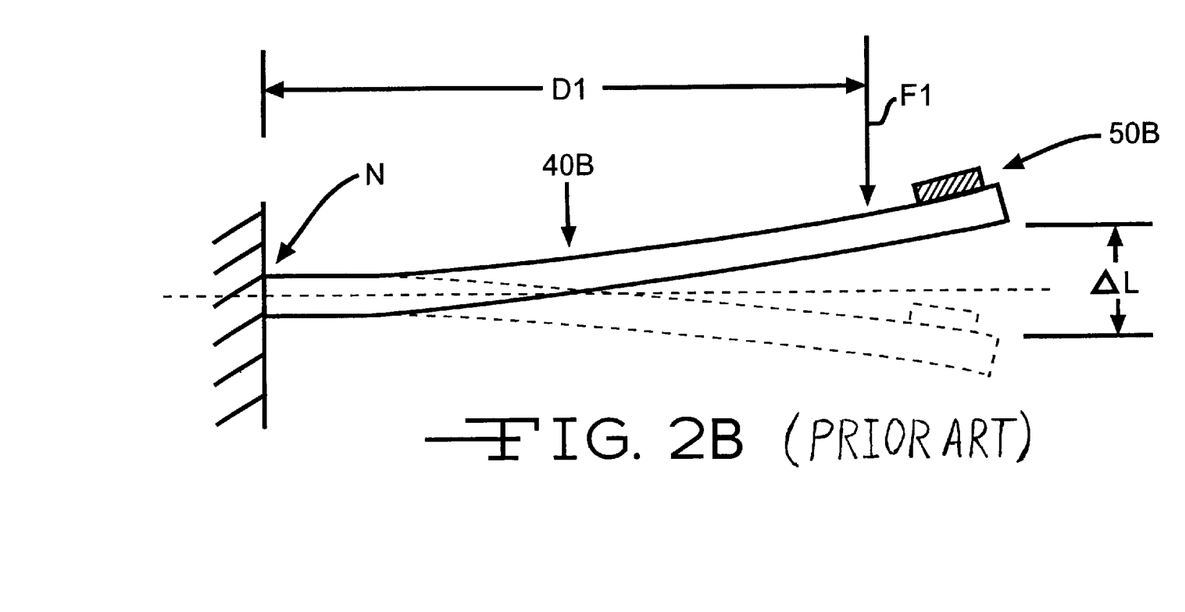
Figure 3:
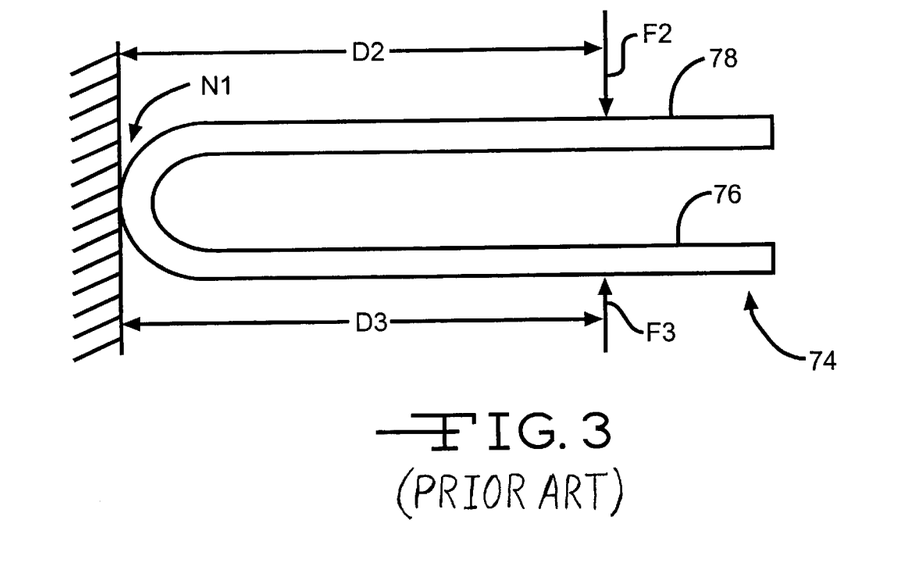
FIG. 3 is a diagrammatic view of a tuning fork system for use in a sensor.

FIG. 2B illustrates the limits of mechanical motion produced by the beam 40B to produce vibratory motion ΔL at the free end of the beam. It should be noted that any torque generated on the mechanical mounting node N by the motion of the cantilever beam is not compensated by any equal and opposite torque which would be generated, for example, by the tuning fork system 74 as shown in FIG. 3. In FIG. 3 torque T2 is exactly compensated by torque T3. T3 has the same magnitude but opposite direction because the tine 76 associated with T3 is always moving in a 180° phase related motion to the tine 78 associated with T2, as conventionally known. Therefore node N1 experiences equal and opposite torque to produce no net torque.

In the case of the system of FIG. 2 where the single cantilever operation is uncompensated and node (N) is not massive and therefore not mechanically "stiff", node (N) will be vibrated and will enter into the mechanical equation describing the motion of the cantilever as to operating frequency and motion ΔL at the free end of the cantilever. As the degree of stiffness of the node (N) is also dependent upon the mass of the sensor/probe holding fixturing, the amplitude of oscillation of the free end and thus electrode 50 will also depend upon the fixturing stiffness and therefore the particular application which the sensor/probe is placed. Any unstableness of the amplitude of electrode 50 will adversely affect the accuracy and stability of the electrostatic quantity sensed by the sensor/probe particularly when an attempt is made to reduce the size and/or weight of the sensor/probe structure thus resulting in a less massive or less stiffness of the node (N).

Figure 4A:
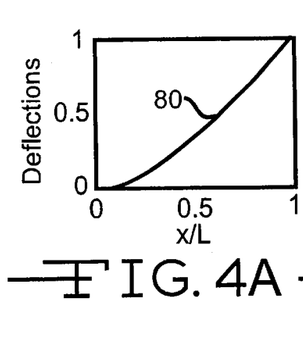
FIGS. 4A, 4B and 4C are graphs illustrating vibrational modes of a cantilever beam of the type shown in FIGS. 2A and 2B.
Figure 4B:
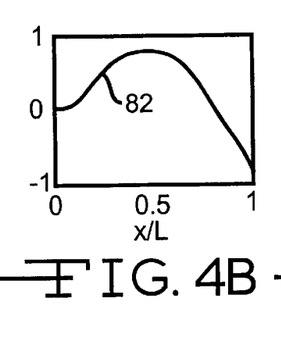
Figure 4C:
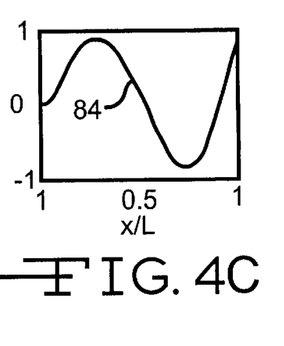

The foregoing is further illustrated by considering the dynamics of thin cantilevered beams. Any vibrating beam will exhibit a set of discrete, resonant modes, the shapes and frequencies of which depend on the nature of the imposed boundary conditions. In FIGS. 4A, 4B and 4C curves 80, 82 and 84 depict the shapes of the first three vibrational modes (n=1, 2, 3, respectively) for a cantilevered beam with one clamped end and one free end. These modes are infinite in number, though only the first few are likely to be of any practical significance in a device of the type described herein. The n=1 mode is very similar in appearance to the static displacement of a beam subjected to a normal load at the end. The n=2 mode has a single inflection point and zero-crossing and the n=3 mode has two inflections and zero-crossings. Successively higher modes feature additional inflection points and zero-crossings.

The resonant frequencies of the modes have prescribed ratios with respect to each other. For a beam with ideal clamping—which imposes the conditions of zero motion and zero slope at the fixed end—the ratios are:

$$f_1:f_2:f_3: \ldots = 1:6.2:17.5: \ldots$$

Thus, if the first resonance is at $f_1$=400 Hz, then $f_2$=2.48 kHz, $f_3$=7.0 kHz, and so forth. In a metallic beam, the mechanical losses are low, so that the quality factors of the modes are high, that is, $Q_1$, $Q_2$, $Q_3$>50. Thus, the resonances may be considered to be well-isolated.

Ideal clamping is impossible to approach in any practical, that is, manufacturable probe of the type shown in FIG. 1, but it is also unnecessary. The resonant modes for the design shown in FIG. 1 are found to have shapes very similar to those of the "ideally clamped" case shown in FIGS. 4A, 4B and 4C; however, the ratio of the resonant frequencies is somewhat altered:

$$f_1:f_2:f_3: \ldots = 1:\sim8:\sim22: \ldots$$

Another observation is that, as long as the piece is securely welded to its housing, the vibrational losses of these well-isolated resonances remain low, that is, Q>50.

The differing shapes for the modes suggest that one should be able to excite selectively and optimally a given mode by proper placement of the piezoelectric actuator. Likewise, the position of a piezoelectric element might be optimized in order to detect the presence of a given mode with the maximum achievable sensitivity. Piezoelectric transducers convert AC electrical excitation into mechanical deformation. When one of these elements is rigidly attached to a beam, the voltage-induced changes in the lateral dimensions of the element—along the surface of the beam—induce a shear that causes the beam to deflect. Thus, as determined in accordance with the present invention, the best location for exciting (and also for sensing) any mode is at the point where the curvature of the deflected beam is greatest. This simple hypothesis about optimal transducer placement has been experimentally verified for the n=1, 2, and 3 modes of a cantilevered beam.

Figure 5:
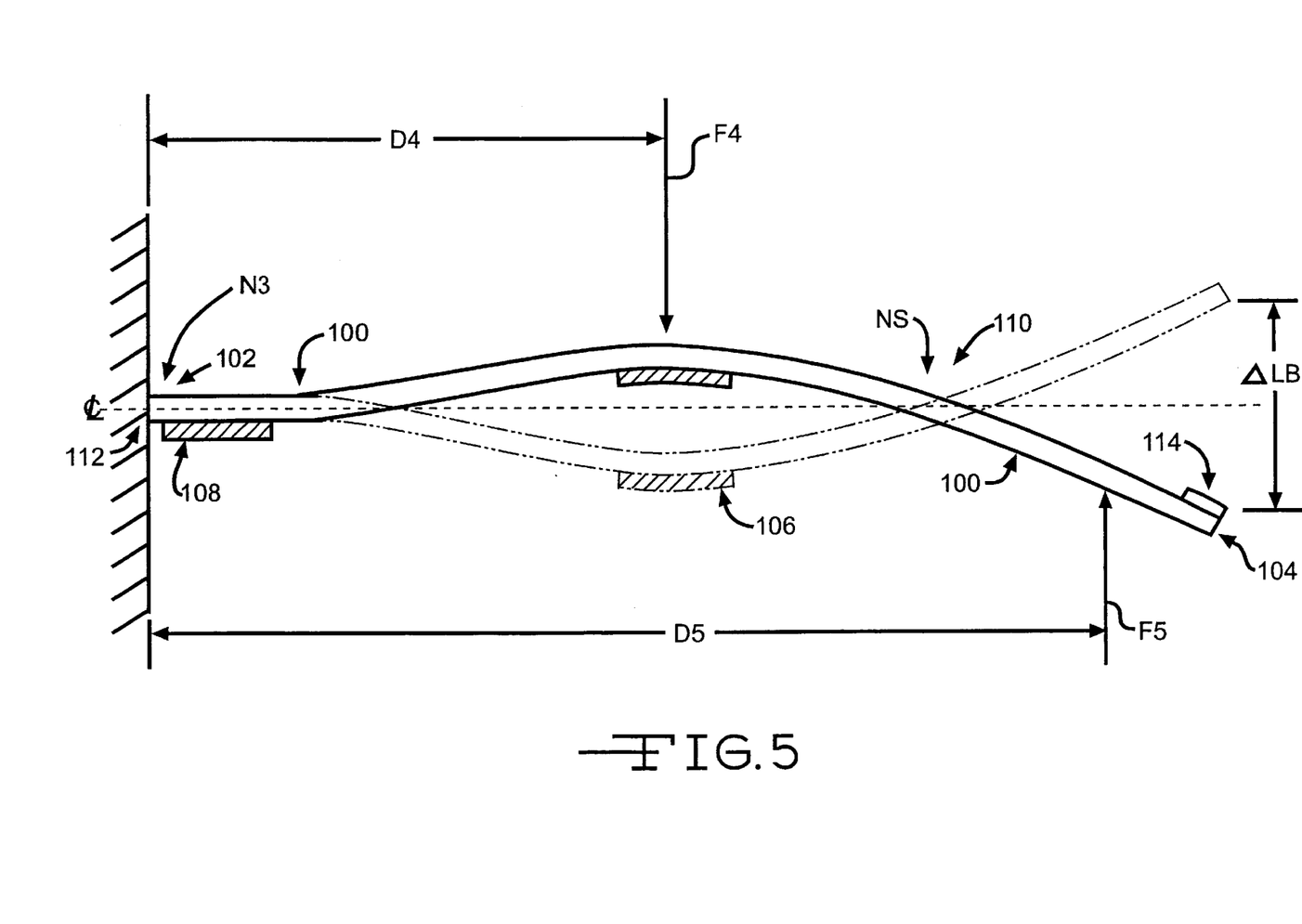
FIG. 5 is a diagrammatic view of a sensor employing a cantilever beam according to the present invention.

FIG. 5 illustrates operation of the cantilever beam 100 of the sensor of the instant invention. As shown, cantilever beam (100) is supported at a mechanical node (N3), also designated 102, while the other 104 is free to vibrate. The oscillator circuitry as well as the placement of the drive 106 and feedback 108 piezoelectric ceramic chips along the cantilever beam 100 are different from the oscillator and chip placement in the sensor of U.S. Pat. No. 4,763,078 as will be explained herein. In the instant invention, when power is applied to the oscillator circuitry and piezo chips 106, 108, the cantilever beam 100 vibrates at a frequency which causes a virtual mechanical node labeled (NS), also designated 110, to appear along the cantilever beam. Due to the appearance of the virtual mechanical node (NS) when operating the cantilever 100 at a frequency above its fundamental frequency, a substantially compensating torque can be produced at the mechanical mounting node (N3) so that substantially no net torque is applied at node (N3).

As shown in FIG. 5, the vibration of cantilever beam 100, as defined by the limits of vibration illustrated by the solid and dotted positions, produces a vibration of ΔLB at the end 104 of the beam. As the virtual node (NS) remains stationary over the oscillatory vibration cycle, the portion of the beam between nodes (N3) and (NS) is, at all times, moving in the opposite direction as the section of the beam between node (NS) and the free end 104 of the beam. The production of the substantially compensating torque is shown graphically in FIG. 5. In FIG. 5 torque T4 produced by force F4 applied at distance D4 from node N3 is substantially compensated by torque T5 produced by F5 applied at distance D5 from node N3. Distance D4 is measured from node N3 to the center of mass of beam 100, and distance D5 is measured from node N3 to the reflected center of mass located between node (NS) and end 104.

When the substantially compensating torque T5 is produced, substantially no net torque is applied to node N3. With substantially no net torque applied at node N3, node N3 cannot be vibrated and therefore its degree of stiffness does not significantly affect the operating frequency of the beam 100 and/or the displacement ΔLB at the end 104 of the cantilever 100. Thus the single cantilever beam 100 can be made to act as if its mounting node is torque compensated, similar to a tuning fork, when the cantilever is operated at a frequency which produces a virtual mechanical node, or multiple virtual mechanical nodes, at the proper position along the cantilever beam. With its mounting node torque substantially compensated, the variation of the vibration amplitude ΔLB and thus the detector's motion amplitude at the end of the beam is made independent of both the mass of the sensor/probe and/or the mass of the clamping/holding fixturing used to place the sensor/probe into its measuring position relative to the surface or area under test. The electrical performance is thus stabilized and is made independent of the particular clamping/holding device used, which is an objective of this invention.

Considering application of the second (n=2) vibrational mode of the cantilevered beam 100 with the drive transducer 106 located so that it overlaps the peak near the middle, the mechanical response of the beam 100 will be maximized because, when deflected, its curvature is the greatest at this point. The feedback piezoelectric transducer 108 employed to sense the motion and to provide a signal to close the feedback loop, is located fairly close to the clamp 112. Placed at another location where the curvature is large, this element is found to sense an entirely adequate signal. The capacitive electrode 114, which is the heart of the non-contacting ESV instrument, is attached very close to the end 104 of the beam 100 where the amplitude of motion is greatest.

Using higher-order modes in a cantilevered beam ameliorates the serious problem relating to vibration isolation between the beam and its mounting. To understand how this improvement is effected, one may compare the shapes of the vibrational modes of the first and second modes in FIGS. 4A and 4B. For the n=1 mode, the beam spends one-half of each cycle entirely above and the other half entirely below the equilibrium position. As a result, a maximum of torque is communicated to the housing by the beam. Because no practical housing or mount can be sufficiently massive to prevent it, this torque always leads to sympathetic vibration of the mount, and other components to which the probe is attached. On the other hand, for the n=2 mode, the deflection always bisects the equilibrium position, thereby providing some degree of balance between the outer and inner portions of the beam. The degree of self-balance increases as mode number n rises. Whether or not, due to other practical limiting factors, modes beyond the second (n=2) can be exploited has not yet been demonstrated. Still, from the standpoint of vibration isolation, the higher modes are better.

Another advantage of using higher-order modes is that a higher operational frequency for the probe improves the robustness of the support electronics and also increases the achievable sampling rate when the probe is used to measure electrostatic surface potential in critical applications such as xerographic copier/printers. This latter feature will offer a significant enhancement to xerographic process controllability of possibly great importance for the new class of low-cost, color copier/printers (three primaries+black) now on the horizon. If present-day black and white copy speeds are to be approached in color machines, higher speed—and improved spatial resolution of photoreceptor charge—will be essential. Improved spatial resolution is crucial to achieving the more restrictive registration requirements of color technology.

Consider the following example to illustrate the improvement. The second mode of a one cm cantilevered beam in a non-contacting electrostatic voltmeter (ESV) shifts the operating frequency from about 400 Hz to about 2400 Hz. This six-fold increase considerably improves the effective ESV bandwidth. Another advantage is that the mechanical loss of the second mode is smaller than the first, that is, $Q_2 > Q_1$. The higher Q of the second mode is valuable in two respects. First, it improves the electrical-to-mechanical efficiency of the piezoelectric drive transducer, which translates to stronger vibrational motion for given AC excitation. Second, higher Q improves the robustness of the feedback control circuitry by improved filtering of noise signals from the output of the sensing piezoelectric element.

Figure 6:
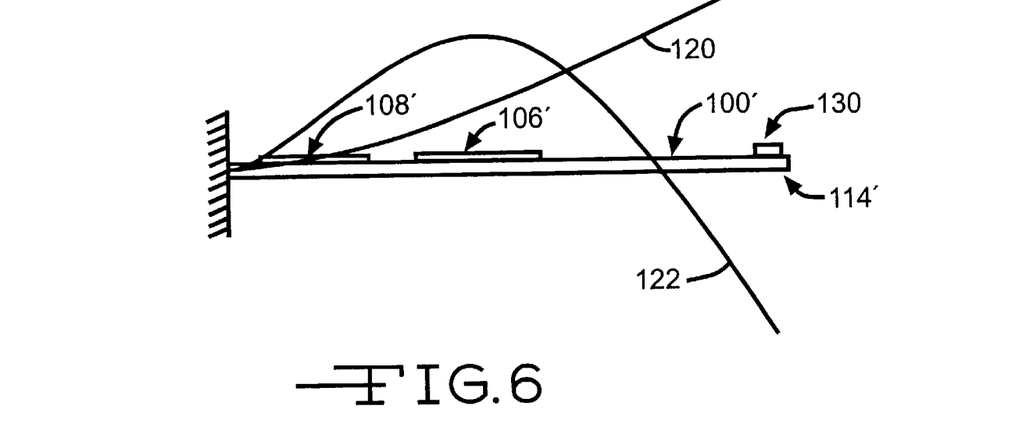
FIG. 6 is a diagrammatic view further illustrating the present invention.

The foregoing is illustrated further by considering FIG. 6 which illustrates the first and second modes for a cantilevered beam for an electrostatic voltmeter according to the present invention. Beam 100' is provided with drive and feedback piezo transducers 106' and 108', respectively, and capacitive sensor 114'. FIG. 6 also shows the displacement profiles 120 and 122 for the first (n=1) and second (n=2) modes. The Euler-Bernoulli continuum beam model gives a simple expression for the natural frequency of the first mode:

$$f_1 = \frac{1}{2\pi} \frac{(1.875)^2 t}{L^2} \sqrt{\frac{E}{\rho}}$$

where L and t are the length and width of the beam, and E and ρ are Young's modulus and the mass density of the material, respectively.

For typical ESV probe dimensions, the n=1 mode provides achievable resonant frequency about half the value needed to provide sufficient sampling bandwidth for color copiers. In addition, the resonance peak of assembled ESV probe units exhibits unacceptably high sensitivity to the method of mounting in a copier. The foregoing equation shows that, once the beam material has been chosen, the resonant frequency can be changed only by varying length L or thickness t. Increasing the frequency this way reduces the amplitude, which in turn lowers the voltage-detecting sensitivity of the probe.

Exploiting the second (n=2) mode instead of the first alleviates both these problems, and with minimal redesign of beam or housing. The resonant frequency of the second mode, shown in FIG. 6, is:

$$f_2 = \frac{1}{2\pi} \frac{(4.694)^2 t}{L^2} \sqrt{\frac{E}{\rho}}$$

From both equations, it follows that $f_2/f_1 \approx 6.3$, thereby solving the first problem. Furthermore, we find experimentally that the sensitivity to mounting of the n=2 resonance peak is much lower than for the n=1 mode, presumably because the motion of the second mode tends to be self-balancing. By comparison, the vibration of the first resonance virtually vanishes for some mounting arrangements, whereas the amplitude of the second resonance drops only 10% to 30%. It is very important to note that efficient excitation and detection of the n=2 mode require placement of piezotransducer elements near maxima of the curvature. FIG. 6 shows optimized placements for the drive 106' and motion-sensing 108' elements. Likewise, the capacitative (ESV) electrode 114' must be located either near the end of the beam (as shown in FIG. 6), or at the location of the local maximum displacement closer to the clamped end.

Figure 7:
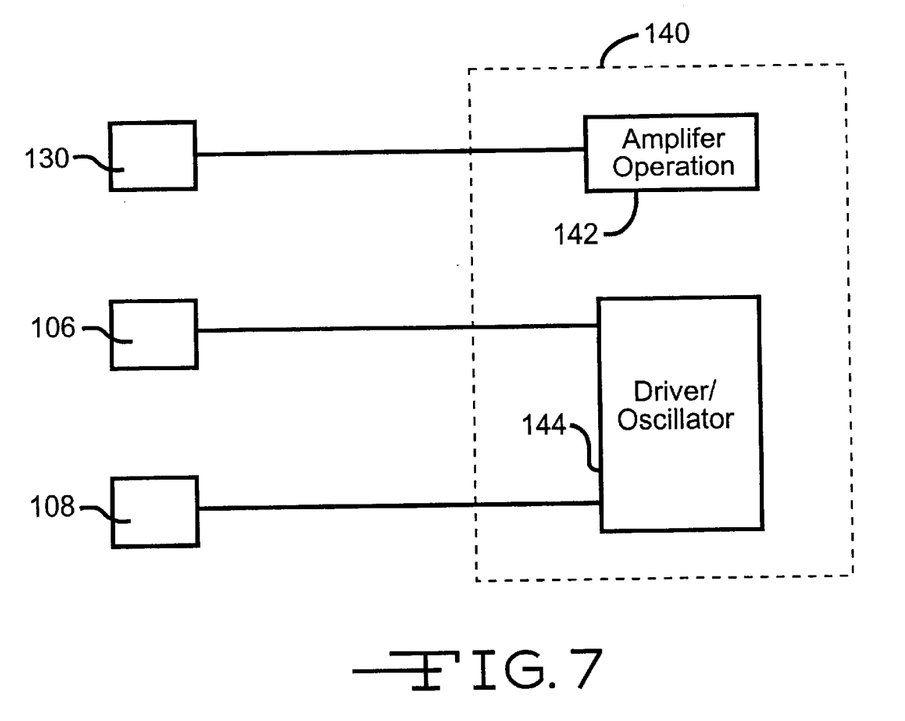
FIG. 7 is a schematic block diagram of a circuit for use with the sensor of the present invention.

An amplifier 130 is provided on beam 100 and functions in a manner similar to that of amplifier 100 disclosed in the above-referenced U.S. Pat. No. 4,763,078. A circuit 140 for operating the sensor of FIGS. 5 and 6 is shown diagrammatically in FIG. 7. Circuit 140 has a portion 142 operatively connected to amplifier 130 for providing operating voltages for the amplifier and for pre-processing signals received from amplifier 130 and transmitting such signals to the signal processing/monitoring portion of the electrostatic voltmeter in a known manner. Circuit 140 also has a drive or oscillator portion 144 for providing drive signals to operate the drive transducer 106 to vibrate the beam. The feedback transducer 108 is connected in controlling relation to portion 144. The frequency of vibration of beam 100 is sensed by transducer 108 and the signal indicative thereof is utilized by circuit portion 144 to control the frequency of the drive signal generated thereby and thus control the vibration frequency of beam 100. The vibrating beam 100 acts as a resonant element of the circuit. The various electrical connections can be made in a manner similar to that disclosed in U.S. Pat. No. 4,763,078.

To facilitate the proper frequency of operation in order to produce virtual node NS designated 110 in FIG. 5, the oscillator circuitry 144 together with the piezo electric ceramic chips 106, 108 operate as a closed loop frequency selective positive feedback system which maintains electrical oscillation at the particular frequency which is synchronous with the mechanical frequency where the virtual node appears. This frequency is related to the fundamental mechanical oscillation frequency of the single cantilever 100 by a factor of approximately six times. Therefore a cantilever of the dimensions illustrated in U.S. Pat. No. 4,763,078 would operate at a frequency of approximately 4 kilohertz when operated according to the principle of this invention, instead of approximately 700 Hz when operating in the fundamental node. This results in the detector operating at the 4 kilohertz frequency thus increasing the speed at which the detector can sense and follow the electrostatic data being measured, thus accomplishing another objective of this invention.

The sensor of the present invention operates in the following manner. The sensor housing is positioned with electrode 114 facing a surface, i.e. a test surface, bearing the electrostatic field or potential to be measured. With the electrode sensitive surface exposed to the test surface there is capacitive coupling between electrode 114 and the test surface. Oscillator 144 applies an a.c. voltage through to piezoelectric element 106 causing it to vibrate in a direction generally perpendicular to the plane of plate from which beam 100 extends and at a frequency substantially equal to the oscillator output frequency. The cantilevered beam 100 transmits the vibrations of piezoelectric element 106 to electrode 114. Electrode 114 is vibrated in a direction generally perpendicular to the plane thereof and at a frequency determined by the oscillator output frequency and the mechanical characteristics of element 100 as previously described. As electrode 114 is vibrated it moves toward and away from the test surface thereby varying the capacitive coupling between the electrode sensitive surface and the test surface.

As element 100 vibrates, the motion thereof generates a voltage in piezoelectric element 108 attached to element 100 which is fed back electrically to the circuit 140 to complete a feedback loop to sustain the oscillation. In particular, the signal fed back representative of the actual vibration or oscillation is compared to a reference signal representative of desired oscillation or vibration, e.g. to control the output of the oscillator. This is done in a manner readily apparent to those skilled in the art so that any further detailed description is believed to be unnecessary.

If the potential of the detector electrode 114, which is the system feedback potential, is different from the potential on the test surface, an a.c. signal is induced on the surface of electrode 114. This induced a.c. signal is applied to the input of preamplifier 130. The amplitude and phase of the induced signal, relative to the drive signal obtained from the oscillator, is dependent on the magnitude and polarity of the difference potential, respectively, of the two surfaces. The output of amplifier 130 is applied to the electrostatic voltmeter and then applied to the input of a demodulator (not shown). The synchronous demodulator, using the drive signal obtained from the oscillator as a reference phase, functions to is remove the amplitude and phase information from the induced a.c. signal. A line frequency derived oscillator signal can be used to insure that the modulation of any ambient induced signals onto the detector electrode 114 cannot appear as noise after the demodulation process. The demodulated signal, which is a d.c. voltage, then can be amplified in a high gain amplifier, and the output of that amplifier is applied to the input of a suitable device, such as a meter, for continual display and monitoring of the test surface potential.

It is therefore apparent that the present invention accomplishes its intended objectives. The sensor according to the present invention utilizes one of the higher-order resonant vibrational modes of the cantilevered beam. It has been shown that these modes, including the n=2 mode and possibly higher modes, can be used in the design of a new class of high-performance probes for non-contacting ESV instruments that are cheaper to manufacture. The improved performance derives from the fact that the higher-order modes resonate at frequencies that are a factor of 6 (or more) higher than the first (n=1) mode. The several advantages of higher frequencies of operation for vibrating element ESV's, while recognized for some time, have never before been seriously considered to be attainable. Cantilevered beams driven at higher-order resonances clearly put the higher frequencies within practical reach.

While embodiments of the present invention have been described in detail, that is done for the purpose of illustration, not limitation.

What is claimed is:

1. A sensor for an electrostatic detector in the form of an electrostatic voltmeter comprising:
   (a) an elongated vibratory element having two ends;
   (b) means for supporting said vibratory element at one of said ends as a cantilever beam and defining a mechanical mounting node at said end;
   (c) a sensitive electrode on said vibrating element near the other of said ends and disposed toward an electrical charge, field or potential being detected having capacitive coupling to said sensitive electrode;
   (d) a drive transducer rigidly attached to said vibratory element at a predetermined location thereon for vibrating said element at a predetermined frequency in a direction to vary the capacitive coupling between said sensitive electrode and the electrical charge, field or potential being detected;
   (e) an oscillator operatively connected to said drive transducer for operating said transducer to vibrate said element;
   (f) the location of said drive transducer and the frequency of vibration of said element being selected to vibrate said element at a frequency above the fundamental vibration frequency of the cantilever beam so that a substantially compensating torque is produced at the mechanical mounting node of the beam so as to greatly reduce net torque applied to said mounting node so that the degree of stiffness of the mounting node does not significantly affect the operating frequency of the beam or the displacement of the free end of the beam; and
   (g) means for deriving an electrical signal from said sensitive electrode containing information about the electrical charge, field or potential being detected.

2. The sensor according to claim 1, wherein said means for deriving an electrical signal comprises an amplifier.

3. The sensor according to claim 1, wherein said drive transducer is at a location on the cantilever beam where the curvature is greatest for the selected mode of vibration of the beam.

4. The sensor according to claim 2, wherein the selected mode of vibration of the beam is the second node.

5. The sensor according to claim 1, further including a feedback transducer on said vibratory element for sensing the vibration frequency of said element.

6. The sensor according to claim 5, further including a control connected to said feedback transducer and connected to said oscillator for controlling said oscillator to vibrate said element at the predetermined frequency.

7. A sensor for an electrostatic detector in the form of an electrostatic voltmeter comprising:
   (a) an elongated vibratory element having two ends;
   (b) means for supporting said vibratory element at one of said ends as a cantilever beam and defining a mechanical mounting node at said end;
   (c) a sensitive electrode on said vibratory element near the other of said ends and disposed toward an electrical charge, field or potential being detected having capacitive coupling to said sensitive electrode;
   (d) a drive transducer rigidly attached to said vibratory element at a predetermined location thereon for vibrating said element at a predetermined frequency in a direction to vary the capacitive coupling between said sensitive electrode and the electrical charge, field or potential being detected;
   (e) an oscillator operatively connected to said drive transducer for operating said transducer to vibrate said element;
   (f) said drive transducer being operated at a frequency corresponding to the second vibrational mode of said cantilever beam and said transducer being located on said vibratory element in overlapping relation to the peak of the mode corresponding to the second vibrational mode at the middle thereof; and
   (g) means for deriving an electrical signal from said sensitive electrode containing information about the electrical charge, field or potential being detected;
   (h) so that vibration isolation is provided between the cantilever beam and the mechanical mounting node.

8. The sensor according to claim 7, wherein said means for deriving an electrical signal comprises an amplifier.

9. The sensor according to claim 7, further including a feedback transducer on said vibrating element for sensing the vibration of said element.

10. The sensor according to claim 9, further including a control connected to said feedback transducer and connected to said oscillator for controlling said oscillator to operate said drive transducer at said frequency corresponding to the second vibrational mode.

11. A method for operating a sensor for an electrostatic detector in the form of an electrostatic voltmeter wherein the sensor comprises an elongated vibratory element supported at a mounting node as a cantilever beam and having a sensing electrode on the free end thereof and wherein the element is vibrated to vary the capacitive coupling between the sensitive electrode and an electrical charge, field or potential being detected, said method comprising:
   (a) applying a vibratory force to said element at a location thereon and at a frequency to vibrate the element at a frequency above the fundamental vibration frequency of the cantilever beam so that a substantially compensatory torque is produced at the mounting node of the element so that substantially no net torque is applied at the mounting node so that the degree of stiffness of the mounting node does not affect the operating frequency of the beam or the displacement of the free end of the beam; and
   (b) deriving an electrical signal from the sensitive electrode containing information about the electrical charge, field or potential being detected.

12. The method according to claim 11, further including:
   (a) sensing the vibration frequency of the element; and
   (b) utilizing the sensed vibration frequency to control the frequency of the vibration force applied to the element.

13. The method according to claim 11, wherein the vibratory force is applied at a location on the cantilever beam where the curvature is greatest for the selected mode of vibration of the beam.

14. The method according to claim 11, wherein the selected mode of vibration of the beam is the second node.

15. A method for operating a sensor for an electrostatic detector in the form of an electrostatic voltmeter wherein the sensor comprises an elongated vibratory element supported at a mounting node as a cantilever beam and having a sensing electrode on the free end thereof and wherein the element is vibrated to vary the capacitive coupling between the sensitive electrode and an electrical charge, field or potential being detected, said method comprising:

(a) applying a vibratory force to said element at a frequency corresponding to the second vibrational mode of the cantilever beam and at a location on the element in overlapping relation to the peak of the node corresponding to the second vibrational mode at the middle thereof; and (b) deriving an electrical signal from the sensitive electrode containing information about the electrical charge, field or potential being detected;

(c) so that vibration isolation is provided between the cantilever beam and the mechanical mounting node.

16. The method according to claim 15, further including:

(a) sensing the vibration frequency of the element; and (b) utilizing the sensed vibration frequency to control the frequency of the vibration force applied to the element.

* * * * *